United States Patent
Liu et al.

(10) Patent No.: US 11,081,574 B2
(45) Date of Patent: Aug. 3, 2021

(54) IGBT POWER DEVICE

(71) Applicant: SUZHOU ORIENTAL SEMICONDUCTOR CO., LTD., Jiangsu (CN)

(72) Inventors: Wei Liu, Jiangsu (CN); Yuanlin Yuan, Jiangsu (CN); Lei Liu, Jiangsu (CN); Rui Wang, Jiangsu (CN); Yi Gong, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 11 days.

(21) Appl. No.: 16/627,675

(22) PCT Filed: Oct. 29, 2018

(86) PCT No.: PCT/CN2018/112338
§ 371 (c)(1),
(2) Date: Dec. 30, 2019

(87) PCT Pub. No.: WO2019/085850
PCT Pub. Date: May 9, 2019

(65) Prior Publication Data
US 2020/0161458 A1  May 21, 2020

(30) Foreign Application Priority Data

Nov. 1, 2017  (CN) .......................... 201711058063.2
Nov. 1, 2017  (CN) .......................... 201711058074.0
Nov. 1, 2017  (CN) .......................... 201711058787.7

(51) Int. Cl.
*H01L 29/739* (2006.01)
*H03K 17/567* (2006.01)

(52) U.S. Cl.
CPC ....... *H01L 29/7395* (2013.01); *H03K 17/567* (2013.01)

(58) Field of Classification Search
None
See application file for complete search history.

(56) References Cited

U.S. PATENT DOCUMENTS 9,240,450 B2 * 1/2016 Werber ............... H01L 29/1095

FOREIGN PATENT DOCUMENTS

CN       1941413 A     4/2007
CN     101887913 A    11/2010
(Continued)

OTHER PUBLICATIONS

International Search Report on International Application No. PCT/CN2018/112338, dated Jan. 25, 2019 (4 pages).

*Primary Examiner* — Hsien Ming Lee
(74) *Attorney, Agent, or Firm* — Buchanan Ingersoll & Rooney PC

(57) ABSTRACT

Disclosed is an insulated gate bipolar transistor (IGBT) power device, including a bipolar transistor, a first MOS transistor, a second MOS transistor, a body diode and a body region contact diode. An anode of the body region contact diode and an anode of the body diode are connected to the bipolar transistor. A first gate of the first MOS transistor is externally connected to a gate voltage of the IGBT power device and configured to control turning on and off of the first MOS transistor by means of the gate voltage of the IGBT power device. A second gate of the second MOS transistor is connected to an emitter voltage of the IGBT power device and configured to control turning on and off of the second MOS transistor by means of the emitter voltage of the IGBT power device.

9 Claims, 7 Drawing Sheets

(56) References Cited

FOREIGN PATENT DOCUMENTS

| CN | 102945804 A | 2/2013 |
|---|---|---|
| CN | 204577432 U | 8/2015 |

\* cited by examiner

IGBT POWER DEVICE

CROSS-REFERENCE TO RELATED APPLICATIONS

This is a National Stage Application, filed under 35 U.S.C. 371, of International Patent Application No. PCT/CN2018/112338, filed on Oct. 29, 2018, which claims priority to Chinese patent application No. 201711058063.2, filed on Nov. 1, 2017, Chinese patent application No. 201711058074.0 filed on Nov. 1, 2017, and Chinese patent application No. 201711058787.7 filed on Nov. 1, 2017, the disclosures of which are incorporated herein by reference in their entireties.

TECHNICAL FIELD

The present disclosure relates to the technical field of semiconductor power device, for example, an IGBT power device.

BACKGROUND

An insulated gate bipolar transistor (IGBT) power device is a device composed of a metal oxide semiconductor (MOS) transistor and a bipolar transistor. An input pole of the IGBT power device is the MOS transistor, and an output pole of the IGBT power device is a PNP transistor. The IGBT power device combines the advantages of these two transistor devices, i.e., the IGBT power device has not only the advantages of small driving power and a fast turning on and off speed of the MOS transistor, and but also the advantages of a reduced saturation voltage and a large capacity of the bipolar transistor. The IGBT power device has been used more and more widely in modern power electronics technologies, and especially in the applications of high power and medium power tubes with higher frequency.

FIG. 1 shows a cross-sectional structural schematic diagram of an IGBT power device in the related art, including a p-type collector region 31 and an n-type collector region 3 which are arranged at intervals at the bottom, where the p-type collector region 31 and the n-type collector region 3 are connected to a collector voltage through a collector metal contact layer 70. The IGBT power device further includes an n-type field cut-off region 32 and an n-type drift region 30, where the n-type field cut-off region 32 is disposed above the p-type collector region 31 and the n-type collector region 3, the n-type drift region 30 is disposed above the n-type field cut-off region 32. At least two p-type body regions 33 are arranged within the n-type drift region 30, and a parasitic body diode structure in the IGBT power device is formed between the p-type body region 33 and the n-type drift region 30. A p-type body region contact region 38 and an n-type source region 34 are arranged within the p-type body region 33, and the n-type source region 34 and the p-type body region contact region 38 are connected to an emitter voltage through an emitter metal contact layer 47. Generally, a doped concentration of the p-type body region contact region 38 is higher than a maximum peak of a doped concentration of the p-type body region 33, such that an ohmic contact structure is formed between the p-type body region contact region 38 and the emitter metal contact layer 47. The IGBT power device further includes a gate dielectric layer 35 and a gate 36 disposed above a current channel of the IGBT power device. An insulating dielectric layer 50 is an interlayer insulating dielectric layer.

The turning on and off of the IGBT power device is controlled by a gate-emitter voltage. When the gate-emitter voltage is greater than a threshold voltage Vth of the MOS transistor, a current channel is formed inside the MOS transistor, and a base current is provided for the bipolar transistor via this current channel, such that the IGBT power device is turned on. When the gate-emitter voltage is less than the threshold voltage Vth of the MOS transistor, the current channel in the MOS transistor is turned off, and the base current of the bipolar transistor is cut off, such that the IGBT power device is turned off. In a case that the IGBT power device is turned off, when a collector-emitter voltage is less than 0V, a parasitic body diode in the IGBT power device is in a positive bias state, and a reverse current flows from an emitter to a collector via the body diode; at this time, there is a phenomenon of minority carriers being injected into a current of the body diode, however, the minority carriers are reverse-recovered when the IGBT power device is turned on again, resulting in a large reverse recovery current and a long reverse recovery time of the IGBT power device.

SUMMARY

The present disclosure provides an IGBT power device having a fast reverse recovery function, to solve a problem that an IGBT power device in the related art has a longer reverse recovery time due to a minority carrier injection problem.

Provided is an IGBT power device, including a bipolar transistor, a first metal oxide semiconductor (MOS) transistor, a second MOS transistor, a body diode and a body region contact diode, where an anode of the body region contact diode is connected to an anode of the body diode. A drain of the first MOS transistor is connected to a base of the bipolar transistor, a drain of the second MOS transistor, a cathode of the body diode and an emitter of the bipolar transistor are connected to each other, and connected to a collector voltage of the IGBT power device. A first gate of the first MOS transistor is externally connected to a gate voltage of the IGBT power device. A collector of the bipolar transistor, a source of the first MOS transistor, a source of the second MOS transistor, a second gate of the second MOS transistor and a cathode of the body region contact diode are connected to each other, and connected to an emitter voltage of the IGBT power device.

In an embodiment, the collector of the bipolar transistor is connected to the anode of the body diode.

In an embodiment, a threshold voltage of the first MOS transistor is greater than a threshold voltage of the second MOS transistor.

Provided is an IGBT power device, including a bipolar transistor, a first metal oxide semiconductor (MOS) transistor, a second MOS transistor, a body diode and a body region contact diode, where an anode of the body contact diode, an anode of the body diode and a collector of the bipolar transistor are connected. A drain of the first MOS transistor is connected to a base of the bipolar transistor, a drain of the second MOS transistor, a cathode of the body diode and an emitter of the bipolar transistor are connected to each other, and connected to a collector voltage of the IGBT power device. A first gate of the first MOS transistor is externally connected to a gate voltage of the IGBT power device. A source of the first MOS transistor, a source of the second MOS transistor, a second gate of the second MOS transistor and a cathode of the body region contact diode are connected to each other, and connected to an emitter voltage of the IGBT power device.

In an embodiment, a threshold voltage of the first MOS transistor is greater than a threshold voltage of the second MOS transistor.

Provided is an IGBT power device, including a p-type collector region and an n-type collector region arranged at intervals, where the p-type collector region and the n-type collector region are connected to a collector voltage; an n-type field cut-off region located above the p-type collector region and the n-type collector region, an n-type drift region located above the n-type field cut-off region, at least two p-type body regions arranged in sequence within the n-type drift region, and a first n-type source region, a second n-type source region and a p-type body region contact region which are located within the p-type body region; a conductive layer located above the p-type body region contact region, where the conductive layer and the p-type body region contact region form a body region contact diode structure, where the conductive layer is a cathode of the body region contact diode structure, and the p-type body region contact region is an anode of the body region contact diode structure; a first current channel located within the p-type body region and between the first n-type source region and the n-type drift region, and a first gate and a gate dielectric layer covering the first current channel, where the first gate is externally connected to a gate voltage; and a second current channel located within the p-type body region and between the second n-type source region and the n-type drift region, and a second gate, where the gate dielectric layer covers the second current channel, the second gate, the first n-type source region, the second n-type source region and the conductive layer are electrically connected to each other, and connected to an emitter voltage.

In an embodiment, the conductive layer is an emitter metal contact layer located above the p-type body region, a doped concentration of the p-type body region contact region is lower than a maximum peak of a doped concentration of the p-type body region, the p-type body region contact region and the emitter metal contact layer form a Schottky barrier diode structure.

In an embodiment, the second gate, the first n-type source region and the second n-type source region are externally connected to the emitter voltage through the emitter metal contact layer.

In an embodiment, the conductive layer is an n-type doped region located within the p-type body region, and the n-type doped region and the p-type body region contact region form a silicon-based body region contact diode structure.

In an embodiment, the n-type polysilicon layer is in contact connection with the second gate, the first n-type source region and the second n-type source region, and the n-type polysilicon layer is externally connected to the emitter voltage through the emitter metal contact layer.

In an embodiment, the n-type polysilicon layer is in contact connection with the first n-type source region and the second n-type source region, and the second gate and the n-type polysilicon layer are externally connected to the emitter voltage through the emitter metal contact layer.

In an embodiment, the conductive layer is an n-type doped region located within the p-type body region, and the n-type doped region and the p-type body region contact region form a silicon-based body region contact diode structure.

In an embodiment, the n-type doped region, the second gate, the first n-type source region and the second n-type source region are externally connected to the emitter voltage through the emitter metal contact layer.

In an embodiment, a turn-on voltage of the first current channel is greater than a turn-on voltage of the second current channel.

In an embodiment, the IGBT power device includes a gate groove. The gate groove is located between two adjacent p-type body regions and is recessed within the n-type drift region. The gate dielectric layer, the first gate and the second gate are arranged within the gate groove.

In an embodiment, the IGBT power device further includes a shielded gate groove recessed within the n-type drift region. An opening of the shielded gate groove is located at a bottom of the gate groove. A third gate is arranged within the shielding gate groove. The third gate is separated from the n-type drift region, the first gate and the second gate through an insulating dielectric layer. The third gate, the first n-type source region, the second n-type source region, the second gate and the conductive layer are electrically connected to each other, and connected to the emitter voltage.

In an embodiment, the third gate extends upwardly into the gate groove.

In a case where the IGBT power device provided by the present disclosure is turned off, when an emitter-collector voltage is greater than 0V, the body region contact diode is in a negative bias state, and thus a reverse current flowing through the body diode may be greatly reduced, whereby minority carriers in the body diode are greatly reduced, which in turn may reduce a reverse recovery charge and a reverse recovery time of the IGBT power device, such that the IGBT power device is capable of having a fast reverse recovery function. And meanwhile, when the emitter-collector voltage reaches the threshold voltage of the second MOS transistor (i.e., the turn-on voltage of the second current channel controlled by the second gate), the second MOS transistor is turned on, at this time a reverse current flows from the emitter to the collector via the second current channel.

BRIEF DESCRIPTION OF DRAWINGS

In order to explain the exemplary embodiments of the present disclosure, the drawings used in the description of the embodiments will be described below.

DETAILED DESCRIPTION

Figure 1:
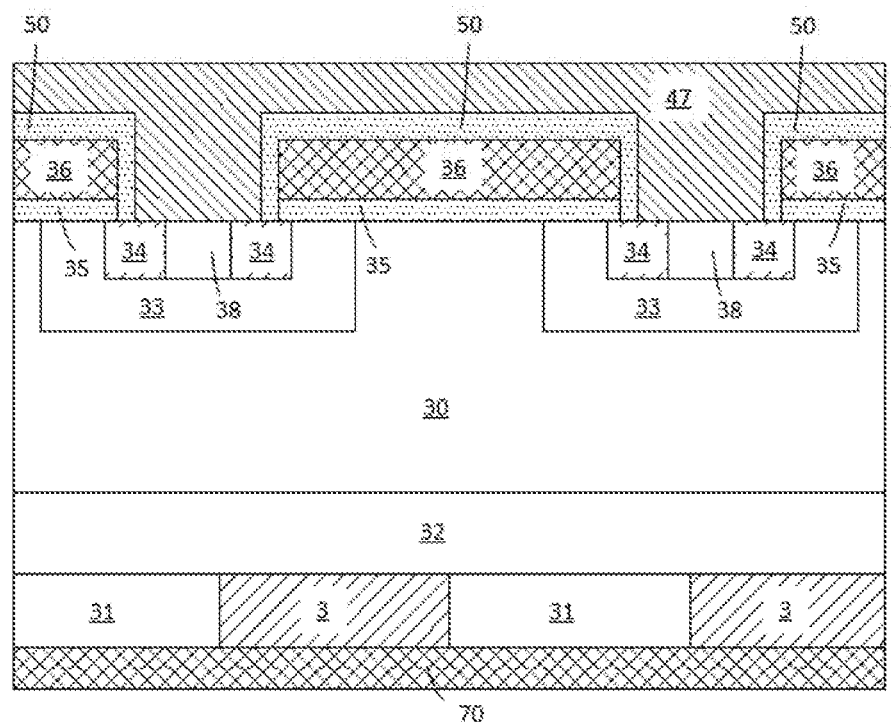
FIG. 1 is a cross-sectional structural schematic diagram of an IGBT power device in the related art.

The present disclosure will be described below by way of specific embodiments in conjunction with the drawings in the present embodiment.

The terms such as "having", "including" and "comprising" and the like used in the present embodiment do not exclude the presence or addition of one or more other elements or combinations thereof. Meanwhile, for the purpose of illustrating the specific embodiments of the present disclosure, the thicknesses of the layers and regions described in the present disclosure are exaggerated in the schematic diagrams listed in the drawings, and the size of the listed figures does not represent an actual dimension, the drawings are schematic. The embodiments listed in the Description should not merely limited to the specific shape of the region shown in the drawings, but should include the resulting shape such as a deviation caused by the preparation and the like.

An insulated gate bipolar transistor (IGBT) power device includes a cell region and a termination region. The cell region is used for obtaining a low on-resistance, and the termination region is used for increasing a withstand voltage of a most marginal cell in the cell region. The termination region is a general structure in an IGBT power device, and has different design structures according to the requirements of different products. A structure of the termination region of the IGBT power device is not shown and described in the present embodiment. The IGBT power device described in the present embodiment refers to a structure of the cell region in the IGBT power device.

Figure 2:
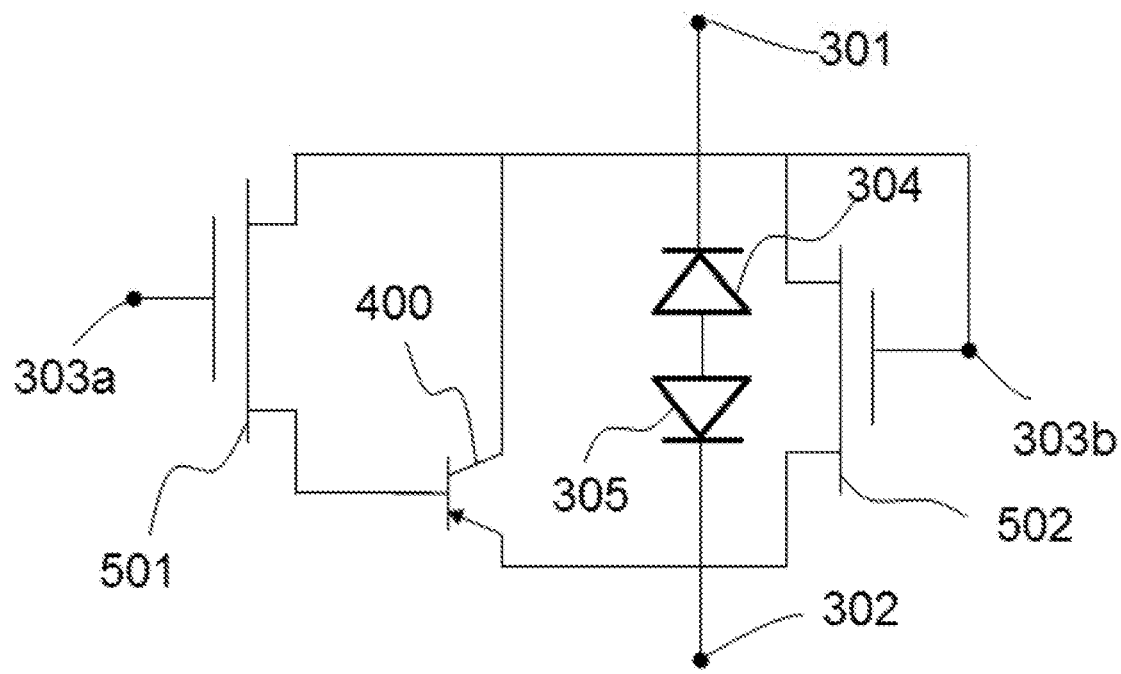
FIG. 2 is a schematic diagram of an equivalent circuit of an IGBT power device provided in an embodiment.

FIG. 2 is a schematic diagram of an equivalent circuit of an IGBT power device provided in the present embodiment. As shown in FIG. 2, the IGBT power device provided in the present embodiment includes a bipolar transistor 400 (a PNP transistor in the present embodiment), a first MOS transistor 501, a second MOS transistor 502, a body diode 305, and a body region contact diode 304, where an anode of the body region contact diode 304 is connected to an anode of the body diode 305.

A drain of the first MOS transistor 501 is connected to a base of the bipolar transistor 400. A drain of the second MOS transistor 502, a cathode of the body diode 305 and an emitter of the bipolar transistor 400 are connected to each other, and connected to a collector 302 of the IGBT power device, such that the drain of the second MOS transistor 502, the cathode of the body diode 305 and the emitter of the bipolar transistor 400 are connected to a collector voltage of the IGBT power device.

A first gate 303a of the first MOS transistor 501 is a gate 303a of the IGBT power device, such that the first gate 303a of the first MOS transistor 501 is connected to a gate voltage of the IGBT power device. The first gate 303a of the first MOS transistor 501 is configured to control turning on and off of the first MOS transistor 501 by means of the gate voltage of the IGBT power device.

A collector of the bipolar transistor 400, a source of the first MOS transistor 501, a source of the second MOS transistor 502, a second gate 303b of the second MOS transistor 502 and a cathode of the body region contact diode 304 are connected to each other, and connected to an emitter 301 of the IGBT power device, such that the collector of the bipolar transistor 400, the source of the first MOS transistor 501, the source of the second MOS transistor 502, the second gate 303b of the second MOS transistor 502 and the cathode of the body region contact diode 304 are connected to an emitter voltage of the IGBT power device. The second gate 303b of the second MOS transistor 502 is configured to control turning on and off of the second MOS transistor 502 by the emitter voltage of the IGBT power device.

In an embodiment, a threshold voltage of the first MOS transistor 501 is greater than a threshold voltage of the second MOS transistor 502.

Figure 3:
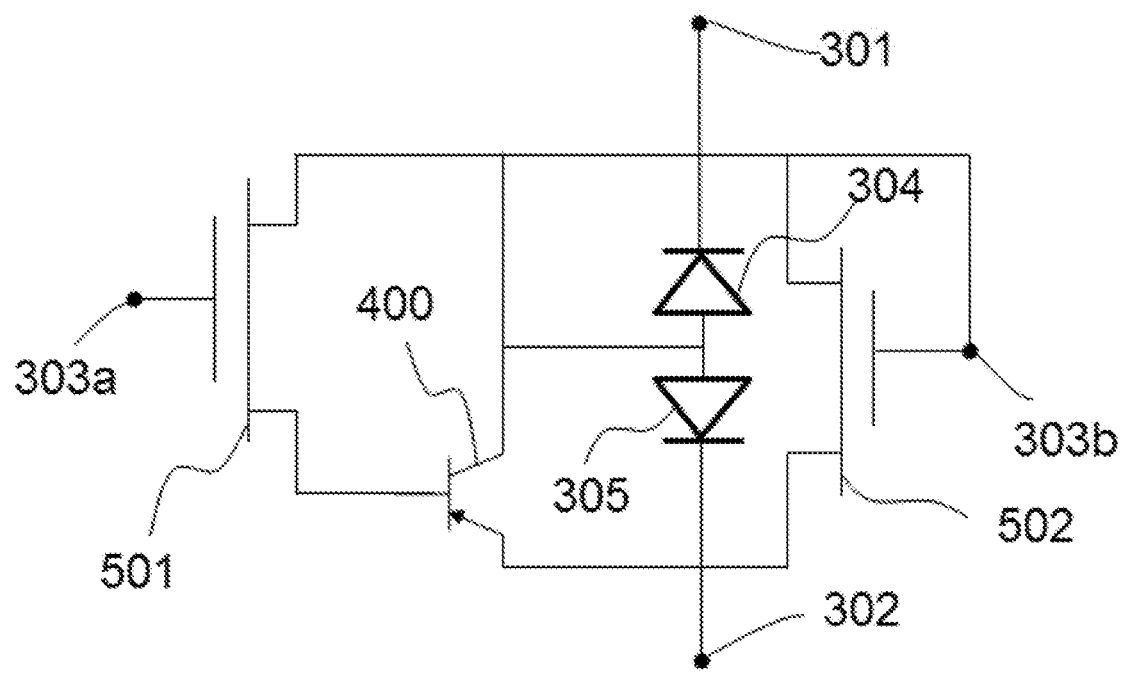
FIG. 3 is a schematic diagram of an equivalent circuit of another IGBT power device provided in an embodiment.

In the IGBT power device shown in FIG. 2, the collector of the bipolar transistor 400 may further connected to the anode of the body diode 305, and a schematic diagram of an equivalent circuit thereof is shown in FIG. 3, and thus a schematic structure of an equivalent circuit of an IGBT power device shown in FIG. 3 is not described in the present embodiment again.

Figure 4:
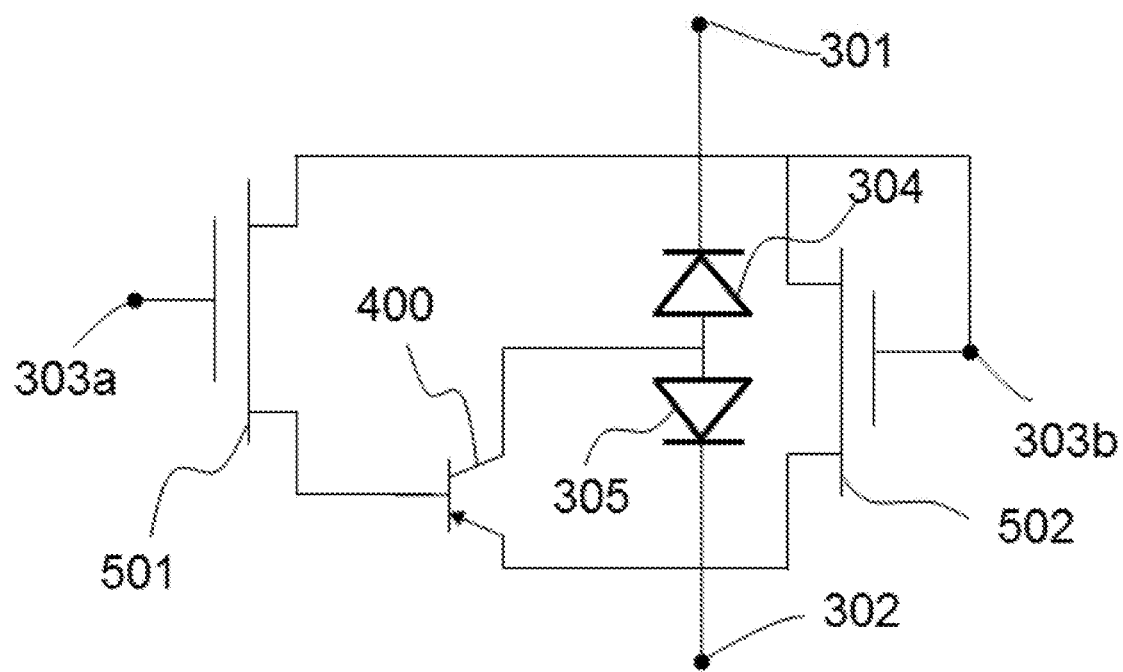
FIG. 4 is a schematic diagram of an equivalent circuit of another IGBT power device provided in an embodiment.

FIG. 4 is a schematic diagram of an equivalent circuit of another IGBT power device provided in the present embodiment. As shown in FIG. 4, the IGBT power device provided in the present embodiment includes a bipolar transistor 400 (a PNP transistor in the present embodiment), a first MOS transistor 501, a second MOS transistor 502, a body diode 305, and a body region contact diode 304, where an anode of the body region contact diode 304, an anode of the body diode 305 and a collector of the bipolar transistor 400 are connected.

A drain of the first MOS transistor 501 is connected to a base of the bipolar transistor 400. A drain of the second MOS transistor 502, a cathode of the body diode 305 and an emitter of the bipolar transistor 400 are connected to each other, and connected to a collector 302 of the IGBT power device, such that the drain of the second MOS transistor 502, the cathode of the body diode 305 and the emitter of the bipolar transistor 400 are connected to a collector voltage of the IGBT power device.

A first gate 303a of the first MOS transistor 501 is a gate 303a of the IGBT power device, such that the first gate 303a of the first MOS transistor 501 is connected to a gate voltage of the IGBT power device. The first gate 303a of the first MOS transistor 501 is configured to control turning on and off of the first MOS transistor 501 by means of the gate voltage of the IGBT power device.

A source of the first MOS transistor 501, a source of the second MOS transistor 502, a second gate 303b of the second MOS transistor 502 and a cathode of the body region contact diode 304 are connected to each other, and connected to an emitter 301 of the IGBT power device, such that the source of the first MOS transistor 501, the source of the second MOS transistor 502, the second gate 303b of the second MOS transistor 502 and the cathode of the body region contact diode 304 are connected to an emitter voltage of the IGBT power device. The second gate 303b of the second MOS transistor 502 is configured to control turning on and off of the second MOS transistor 502 by means of the emitter voltage of the IGBT power device.

The working mechanism of the IGBT power device shown in FIG. 2 to FIG. 4 is that: 1) when a gate-emitter voltage of the IGBT power device reaches the threshold voltage of the first MOS transistor 501, a first current channel inside the first MOS transistor 501 is turned on, and a base current is provided for the bipolar transistor 400 via the first current channel, such that the IGBT power device is turned on; 2) when the gate-emitter voltage of the IGBT power device is less than the threshold voltage of the first MOS transistor 501, the first current channel inside the first MOS transistor 501 is turned off, and the base current of the bipolar transistor 400 is cut off, such that the IGBT power device is turned off.

In a case where the IGBT power device provided in the present embodiment is turned off, when the emitter voltage is greater than the collector voltage, the body region contact diode is in a negative bias state, and thus a reverse current flowing through the body diode may be greatly reduced, thereby minority carriers in the body diode may be greatly reduced, which in turn may greatly reduce a reverse recovery charge and a reverse recovery time of the IGBT power device, such that the IGBT power device is capable of having a fast reverse recovery function. And meanwhile, when an emitter-collector voltage reaches the threshold voltage of the second MOS transistor, a second current channel inside the second MOS transistor is turned on, and a reverse current flows from the emitter to the collector via the second current channel inside the second MOS transistor.

Figure 5:
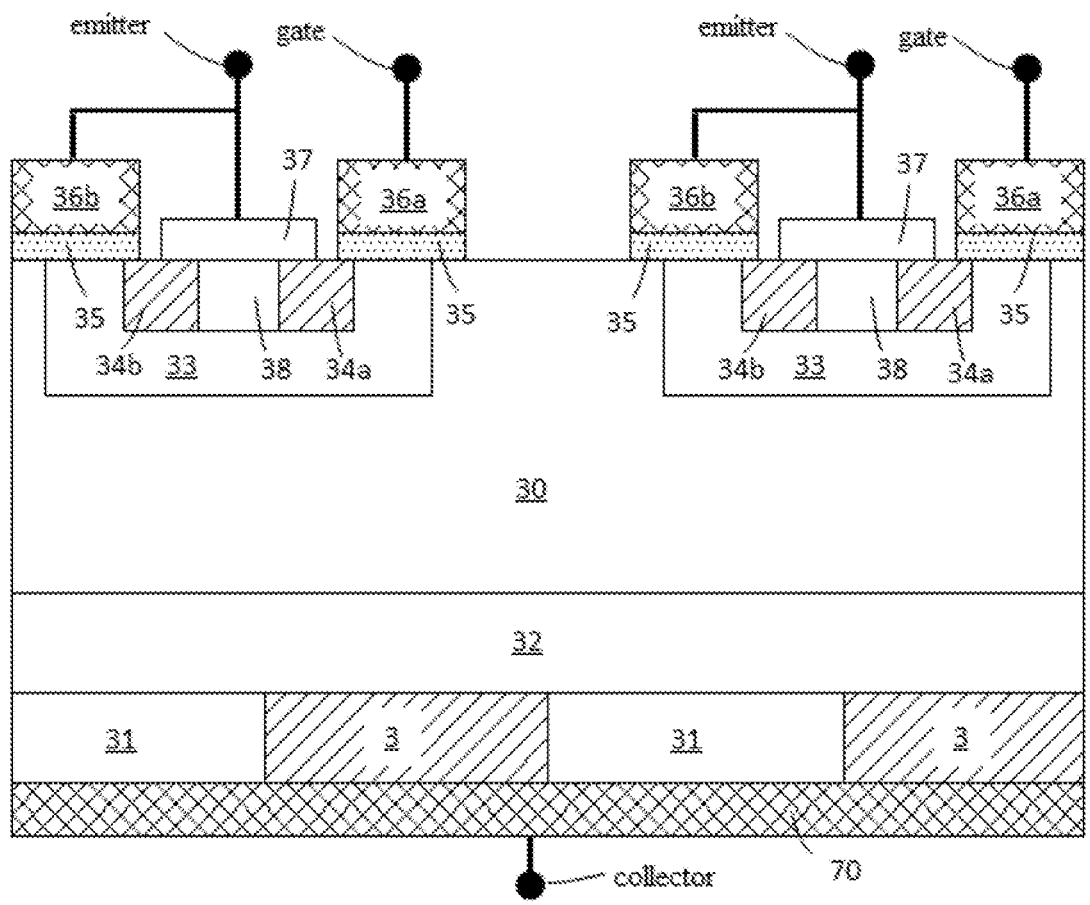
FIG. 5 is a cross-sectional structural schematic diagram of an IGBT power device provided in an embodiment.

FIG. 5 is a cross-sectional structural schematic diagram of an IGBT power device provided in the present embodiment. As shown in FIG. 5, the IGBT power device in the present embodiment includes a p-type collector region 31, an n-type collector region 3, an n-type field cut-off region 32, an n-type drift region 30, and a p-type body region 33. The p-type collector region 31 and the n-type collector region 3 are connected to a collector voltage through a collector metal contact layer 70. The n-type field cut-off region 32 is located above the p-type collector region 31 and the n-type collector region 3. The n-type drift region 30 is located above the n-type field cut-off region 32. The p-type body region 33 is formed within the n-type drift region 30. A number of p-type body regions 33 may be set according to the requirement of an actual product, and structures of only two p-type body regions 33 are exemplarily shown in the present embodiment. A p-type body region contact region 38, a first n-type source region 34a and a second n-type source region 34b are arranged within the p-type body region 33, and the p-type body region contact region 38 is generally arranged between the first n-type source region 34a and the second n-type source region 34b.

A parasitic body diode structure in the IGBT power device is formed between the p-type body region 33 and the n-type drift region 30, where the p-type body region 33 is an anode of the body diode, and the n-type drift region 30 is a cathode of the body diode.

The IGBT power device provided in the present embodiment further includes a first current channel located within the p-type body region 33 and between the first n-type source region 34a and the n-type drift region 30, a first gate 36a and a gate dielectric layer 35 covering the first current channel, where the first gate 36a is externally connected to a gate voltage and is configured to control turning on and off of the first current channel by means of the gate voltage.

The IGBT power device provided in the present embodiment further includes a second current channel located within the p-type body region 33 and between the second n-type source region 34b and the n-type drift region 30, and a second gate 36b, and the gate dielectric layer 35 covers the second current channel.

In an embodiment, a turn-on voltage of the first current channel is greater than a turn-on voltage of the second current channel, and at the same time, the current channel is accumulation and inversion layers that formed on a surface of a semiconductor upon being applied the gate voltage in the MOS transistor structure. In the drawings of the present embodiment, the first current channel and the second current channel in the IGBT power device are both not shown.

The IGBT power device provided in the present embodiment further includes a conductive layer 37 located above the p-type body region contact region 38. The conductive layer 37 and the p-type body region contact region 38 form a body region contact diode structure, where the conductive layer 37 is a cathode of the body region contact diode, and the p-type body region contact region 38 is an anode of the body region contact diode, such that the anode of the body region contact diode is connected to the anode of the body diode. In an embodiment, the conductive layer 37 may be an n-type polysilicon layer or a metal layer located above the p-type body region 33, such that the body region contact diode may be a silicon-based body region contact diode structure or a Schottky barrier diode structure.

The second gate 36b, the first n-type source region 34a, the second n-type source region 34b and the conductive layer 37 are electrically connected, and connected to an emitter voltage, whereby the cathode of the body region contact diode is connected to an emitter, and the second gate 36b is configured to control turning on and off of the second current channel by means of the emitter voltage.

In the embodiment of the IGBT power device shown in FIG. 5, the conductive layer 37 is in direct contact connection with the first n-type source region 34a and the second n-type source region 34b, and thus the conductive layer 37 needs to be electrically connected to the second gate 36b.

Figure 6:
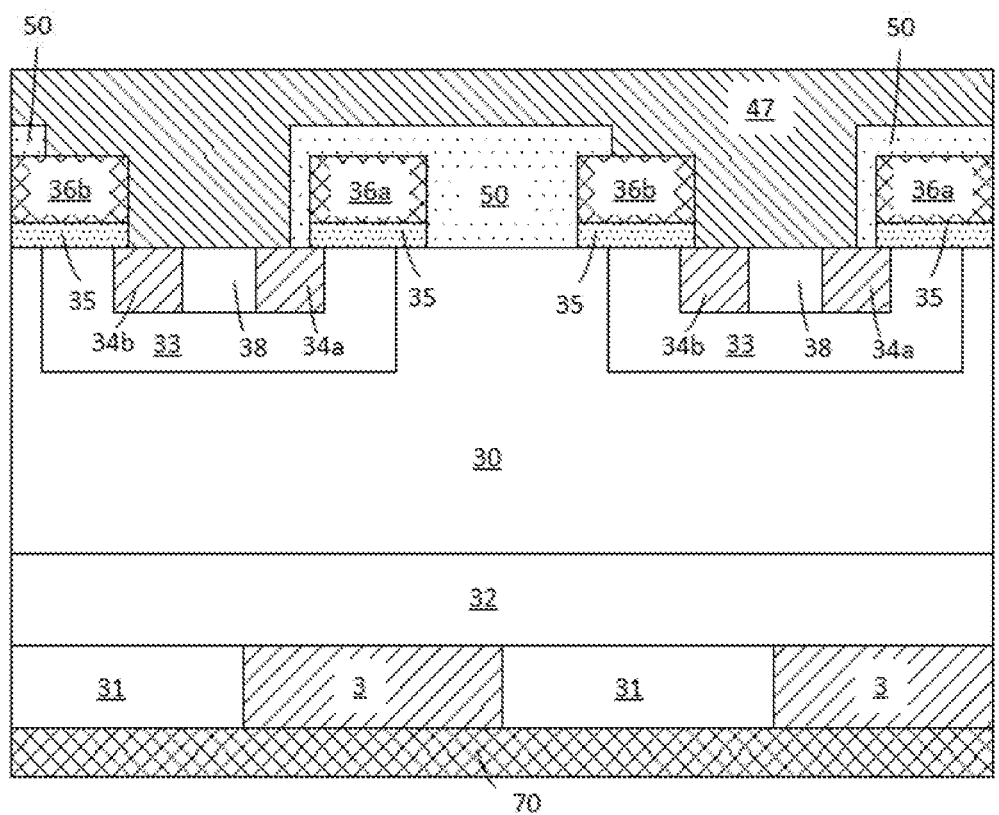
FIG. 6 is a cross-sectional structural schematic diagram of another IGBT power device provided in an embodiment.

FIG. 6 is a cross-sectional structural schematic diagram of another IGBT power device provided in the present embodiment, and corresponds to an embodiment of the IGBT power device provided in the present disclosure in which the body region contact diode adopts a Schottky barrier diode structure on the basis of the embodiment of the IGBT power device shown in FIG. 5. As shown in FIG. 6, an emitter metal contact layer 47 is formed above the p-type body region 33, and the emitter metal contact layer 47 is a conductive layer located above the p-type body region contact region 38; and at this time, a doped concentration of the p-type body region contact region 38 needs to be lower than a maximum peak of a doped concentration of the p-type body region 33, whereby the p-type body region contact region 38 and the emitter metal contact layer 47 form the Schottky barrier diode structure, where the emitter metal contact layer 47 is a cathode of the Schottky barrier diode, and the p-type body region contact region 38 is an anode of the Schottky barrier diode. The emitter metal contact layer 47 is directly connected to the second gate 36b, the first n-type source region 34a and the second n-type source region 34b, and the emitter metal contact layer 47 is externally connected to the emitter voltage, whereby the second gate 36b is configured to control turning on and off of the second current channel by means of the emitter voltage. The first gate electrode 36a is externally connected to the gate voltage through a gate metal contact layer (a structure of the gate metal contact layer is not shown in FIG. 6 based on a positional relationship of a cross-sectional structure), whereby the first gate electrode 36a is configured to control turning on and off of the first current channel by means of the gate voltage. The emitter metal contact layer 47 and the gate metal contact layer are separated by an interlayer insulating layer 50. The interlayer insulating layer 50 is usually a material such as a silicon glass, a borophosphosilicate glass or a phosphosilicate glass.

In the IGBT power device shown in FIG. 6, when a contact barrier of the Schottky barrier diode structure formed by the emitter metal contact layer 47 and the p-type body region contact region 38 is extremely low, the Schottky barrier diode structure may be equivalent to an ohmic contact structure, which may reduce a reverse current flowing through the body diode to a certain extent when the IGBT power device is turned off, thereby minority carriers inside the body diode may be reduced, which in turn may reduce a reverse recovery charge and a reverse recovery time of the IGBT power device, such that the IGBT power device is capable of having a fast reverse recovery function. A reverse recovery speed of the IGBT power device here is slower than a reverse recovery speed of the IGBT power device using a body region contact diode with high contact barriers, but faster than a reverse recovery speed of a traditional IGBT power device without the body region contact diode structure.

Figure 7:
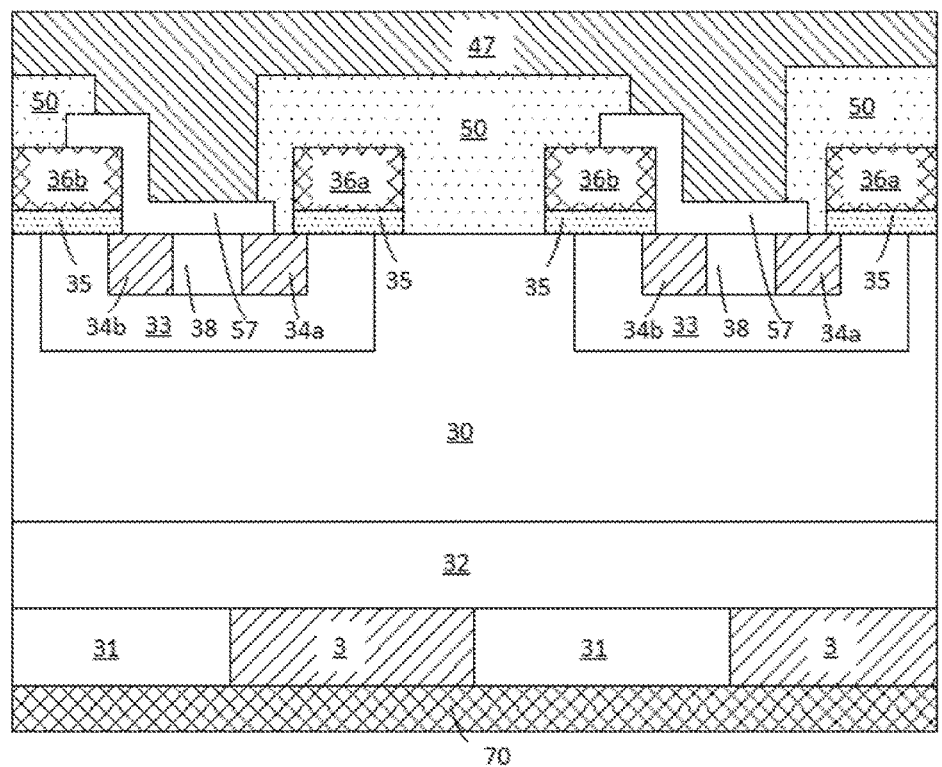
FIG. 7 is a cross-sectional structural schematic diagram of another IGBT power device provided in an embodiment.

FIG. 7 is a cross-sectional structural schematic diagram of another IGBT power device provided in the present embodiment, and corresponds to an embodiment of the IGBT power device provided in the present disclosure in which the body region contact diode adopts a silicon-based body region contact diode on the basis of the embodiment of the IGBT power device shown in FIG. 5. As shown in FIG. 7, an n-type polysilicon layer 57 is formed above the p-type body region 33, and the n-type polysilicon layer 57 is the conductive layer located above the p-type body region contact region 38, whereby the p-type body region contact region 38 and the n-type polysilicon layer 57 form the silicon-based body region contact diode structure, where the n-type polysilicon layer 57 is a cathode of the body region contact diode, and the p-type body contact region 38 is an anode of the body region contact diode. The n-type polysilicon layer 57 may be in direct contact connection with the second gate 36b, the first n-type source region 34a and the second n-type source region 34b, and then the n-type polysilicon layer 57 is externally connected to the emitter voltage through the emitter metal contact layer 47, as shown in FIG. 7. The n-type polysilicon layer 57 may also be in direct contact connection with the first n-type source region 34a and the second n-type source region 34b, and then the second gate 36b and the n-type polysilicon layer 57 are both externally connected to the emitter voltage through the emitter metal contact layer 47. In the present embodiment, the n-type polysilicon layer 57 is in direct contact connection with the second gate 36b, the first n-type source region 34a and the second n-type source region 34b, and then the n-type polysilicon layer 57 is externally connected to the emitter voltage through the emitter metal contact layer 47, whereby the second gate 36b is configured to control turning on and off of the second current channel by means of the emitter voltage. The first gate 36a is externally connected to the gate voltage through a gate metal contact layer (a structure of the gate metal contact layer is not shown in FIG. 7 based on a positional relationship of a cross-sectional structure), whereby the first gate 36a is configured to control turning on and off of the first current channel by means of the gate voltage. The emitter metal contact layer 47 and the gate metal contact layer are separated by an interlayer insulating layer 50.

Figure 8:
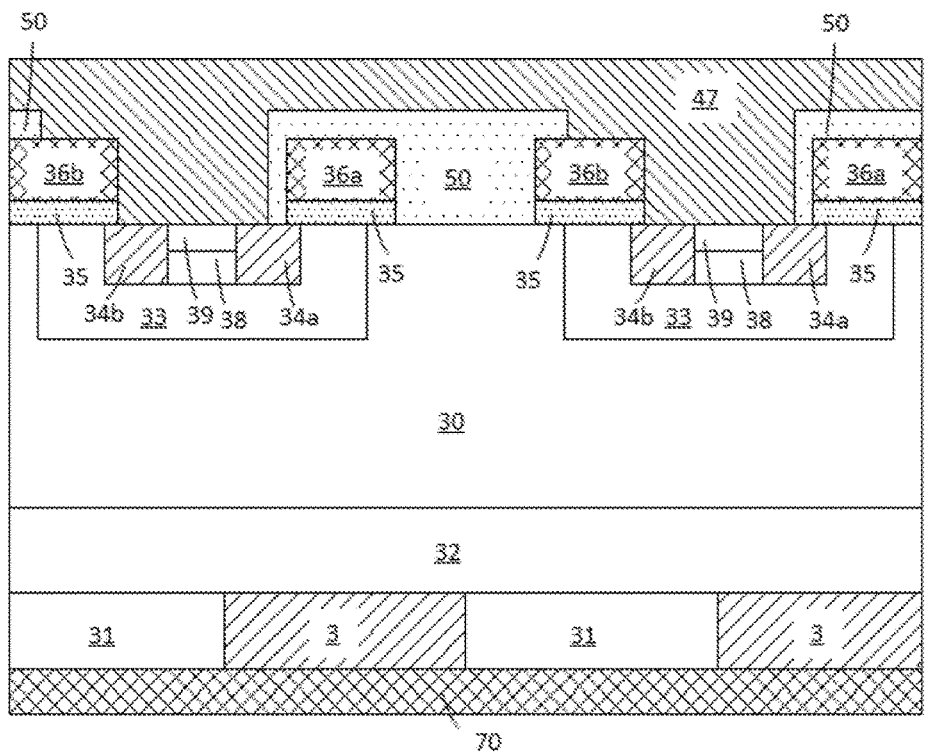
FIG. 8 is a cross-sectional structural schematic diagram of another IGBT power device provided in an embodiment.

FIG. 8 is a cross-sectional structural schematic diagram of another IGBT power device provided in the present embodiment, and corresponds to another embodiment of the IGBT power device provided in the present disclosure in which a body region contact diode adopts a silicon-based body region contact diode. As shown in FIG. 8, the IGBT power device in the present embodiment includes a p-type collector region 31 and an n-type collector region 3, where the p-type collector region 31 and the n-type collector region 3 are connected to a collector voltage through a collector metal contact layer 70. The IGBT power device provided in the present embodiment further includes: an n-type field cut-off region 32 located above the p-type collector region 31 and the n-type collector region 3; an n-type drift region 30 located above the n-type field cut-off region 32; a p-type body region 33 formed within the n-type drift region 30. A p-type body region contact region 38, an n-type doped region 39, a first n-type source region 34a and a second n-type source region 34b are arranged within the p-type body region 33. The p-type body region contact region 38 and the n-type doped region 39 are located between the first n-type source region 34a and the second n-type source region 34b. The n-type doped region 39 is located above the p-type body region contact region 38, and the n-type doped region 39 is a conductive layer located above the p-type body region contact region 38. Thus, the n-type doped region 39 and the p-type body region contact region 38 form a silicon-based body region contact diode structure, where the n-type doped region 39 is a cathode of the body region contact diode, and the p-type body region contact region 38 is an anode of the body region contact diode.

A parasitic body diode structure in the IGBT power device is formed between the p-type body region 33 and the n-type drift region 30, where the p-type body region 33 is an anode of the body diode, and the n-type drift region 30 is a cathode of the body diode, thereby the anode of the body region contact diode is connected to the anode of the body diode.

The IGBT power device provided in the present embodiment further includes a first current channel located within the p-type body region 33 and between the first n-type source region 34a and the n-type drift region 30, a first gate 36a and a gate dielectric layer 35 covering the first current channel, where the first gate 36a is configured to control turning on and off of the first current channel by means of a gate voltage.

The IGBT power device provided in the present embodiment further includes a second current channel located within the p-type body region 33 and between the second n-type source region 34b and the n-type drift region 30, and a second gate 36b, and the dielectric layer 35 covers the second current channel.

The second gate 36b, the first n-type source region 34a, the second n-type source region 34b and the n-type doped region 39 are connected by an emitter metal contact layer 47, and the emitter metal contact layer 47 is externally connected to an emitter voltage, whereby the second gate 36b is configured to control turning on and off of the second current channel by means of the emitter voltage. The first gate electrode 36a is externally connected to the gate voltage through a gate metal contact layer (a structure of the gate metal contact layer is not shown in FIG. 8 based on a positional relationship of a cross-sectional structure), whereby the first gate electrode 36a is configured to control turning on and off of the first current channel by means of the gate voltage. The emitter metal contact layer 47 and the gate metal contact layer are separated by an interlayer insulating layer 50. The interlayer insulating layer 50 is usually a material such as a silicon glass, a borophosphosilicate glass or a phosphosilicate glass.

Figure 9:
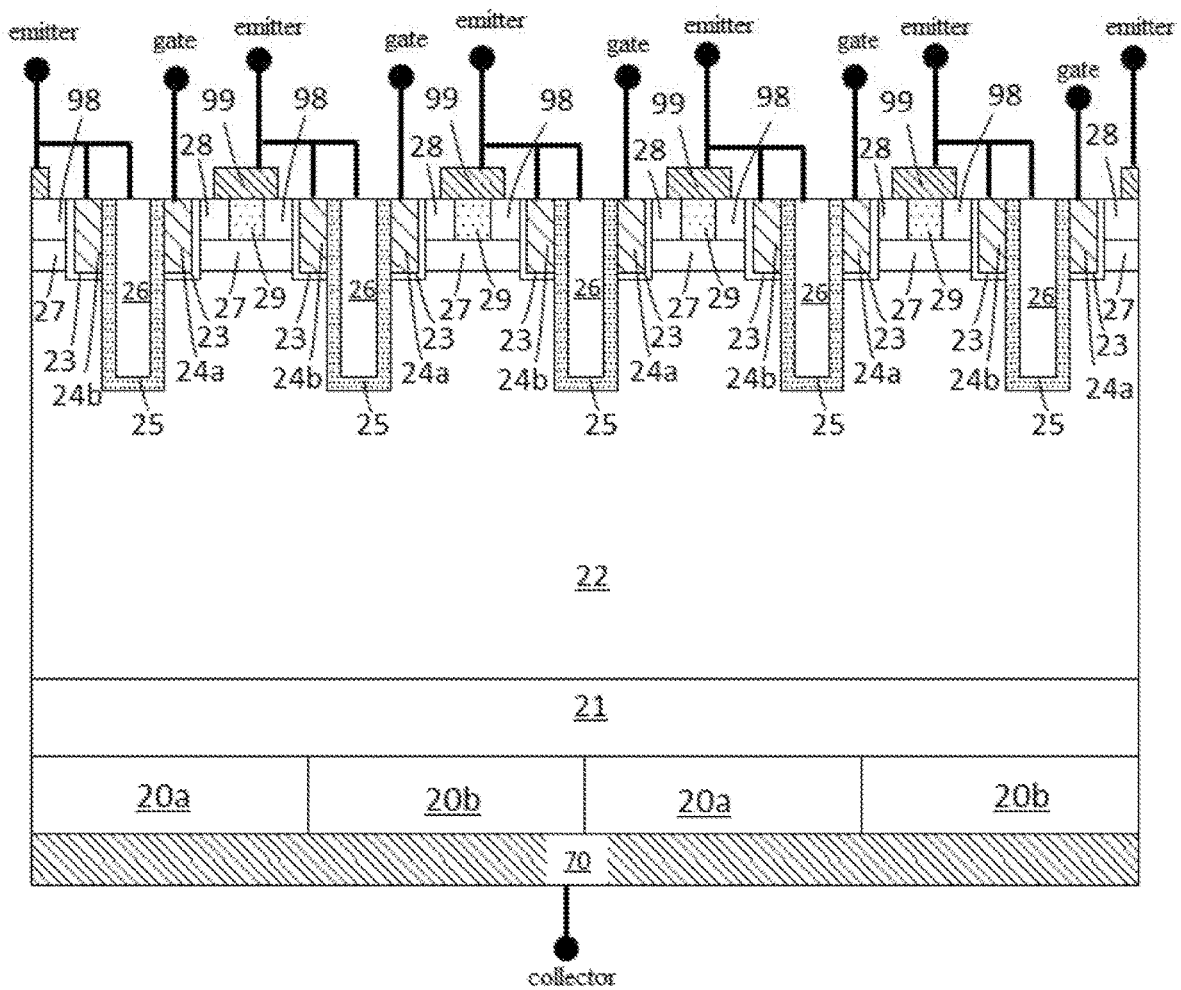
FIG. 9 is a cross-sectional structural schematic diagram of another IGBT power device provided in an embodiment.

FIG. 9 is a cross-sectional structural schematic diagram of another IGBT power device provided in the present embodiment. As shown in FIG. 9, the IGBT power device of the present embodiment includes a p-type collector region 20a and an n-type collector region 20b, where the p-type collector region 20a and the n-type collector region 20b are both externally connected to a collector voltage through a collector metal contact layer 70.

The IGBT power device provided in the present embodiment further includes an n-type field cut-off region 21 located above the p-type collector region 20a and the n-type collector region 20b, and an n-type drift region 22 located above the n-type field cut-off region 21.

The IGBT power device provided in the present embodiment further includes at least two p-type body regions 27 arranged in sequence within the n-type drift region 22. Structures of only six p-type body regions 27 are exemplarily shown in FIG. 9, a p-type body region contact region 29, a first n-type source region 28 and a second n-type source region 98 are arranged within the p-type body region 27, and the p-type body region contact region 29 is generally arranged between the first n-type source region 28 and the second n-type source region 98.

A parasitic body diode structure in the IGBT power device is formed between the p-type body region 27 and the n-type drift region 22, where the p-type body region 27 is an anode of the body diode, and the n-type drift region 22 is a cathode of the body diode.

The IGBT power device provided in the present embodiment further includes a gate groove recessed within the n-type drift region 22 and between the adjacent p-type body regions 27, and a shielded gate groove recessed within the n-type drift region 22, where an opening of the shielded gate groove is located at a bottom of the gate groove. An opening width of the shielding gate groove may be the same as an opening width of the gate groove, or may be greater or less than the opening width of the gate groove.

A depth of the p-type body region 27 may be the same as a depth of the gate groove in the n-type drift region 22, or may be greater or less than the depth of the gate groove, and only the depth of the p-type body region 27 being less than the depth of the gate groove is taken as an example in FIG. 9.

The IGBT power device provided in the present embodiment further includes a conductive layer 99 located above the p-type body region contact region 29, and the conductive layer 99 and the p-type body region contact region 29 form a body region contact diode structure, where the conductive layer 99 is a cathode of the body region contact diode, and the p-type body region contact region 29 is an anode of the body region contact diode. Thereby, the anode of the body region contact diode is connected to the anode of the body diode. The conductive layer 99 may be an n-type polysilicon layer or a metal layer, whereby the body region contact diode structure may be a Schottky barrier diode structure or a silicon-based body region contact diode structure.

The IGBT power device provided in the present embodiment further includes a first current channel located within the p-type body region 27 and between the first n-type source region 28 and the n-type drift region 22, and a first gate 24a and a gate dielectric layer 23 located within the gate groove and covering a sidewall surface of a side of the gate groove facing toward the first n-type source region 28, where the first gate 24a is externally connected to a gate voltage, and the first gate 24a is configured to control turning on and off of the first current channel between the first n-type source region 28 and the n-type drift region 22 by means of the gate voltage.

The IGBT power device provided in the present embodiment further includes a second current channel located within the p-type body region 27 and between the second n-type source region 98 and the n-type drift region 22, and a second gate 24b and the gate dielectric layer 23 located within the gate groove and covering a sidewall surface of a side of the gate groove facing toward the second n-type source region 98.

The IGBT power device provided in the present embodiment further includes a third gate 26 located within the shielded gate groove, where the third gate 26 is separated from the n-type drift region 22, the first gate 24a and the second gate 24b through a field oxide layer 25. In an embodiment, the third gate 26 within the shielded gate groove extends upward into the gate groove, and in a region of the gate groove, the third gate 26 is directly separated from the first gate 24a and the second gate 24b through the field oxide layer 25.

The first n-type source region 28, the second n-type source region 98, the second gate 24b, the third gate 26 and the conductive layer 99 are electrically connected, and connected to an emitter voltage, whereby the second gate 24b is configured to control turning on and off of the second current channel between the second n-type source region 98 and the n-type drift region 22 by means of the emitter voltage, The third gate 26 is a shielded gate, and the third gate 26 forms a lateral electric field in the n-type drift region 22 through the emitter voltage, thereby playing a role of reducing the on-resistance and increasing the withstand voltage.

In an embodiment, a turn-on voltage of the first current channel controlled by the first gate 24a is greater than a turn-on voltage of the second current channel controlled by the second gate 24b. Meanwhile, the current channel in the IGBT power device is accumulation and inversion layers that formed within the p-type body region when a voltage is applied to the gate. In the drawings of the present embodiment, the first current channel controlled by the first gate 24a and the second current channel controlled by the second gate 24b in the IGBT power device are both not shown.

In FIG. 9, the conductive layer 99 is in direct contact connection with the first n-type source region 28 and the second n-type source region 98, and thus the conductive layer 99 needs to be electrically connected to the second gate 24b and the third gate 26.

What is claimed is:

1. An insulated gate bipolar transistor (IGBT) power device, comprising:

a p-type collector region and an n-type collector region arranged at intervals, wherein the p-type collector region and the n-type collector region are connected to a collector voltage;

an n-type field cut-off region located above the p-type collector region and the n-type collector region, an n-type drift region located above the n-type field cut-off region, at least two p-type body regions arranged in sequence within the n-type drift region, and a first n-type source region, a second n-type source region and a p-type body region contact region which are located within each of the at least two p-type body regions;

a conductive layer located above the p-type body region contact region, wherein the conductive layer and the p-type body region contact region form a body region contact diode structure, the conductive layer is a cathode of the body region contact diode structure, and the p-type body region contact region is art anode of the body region contact diode structure;

a first current channel located within each of the at least two p-type body regions and between the first n-type source region and the n-type drift region, and a first gate and a gate dielectric layer covering the first current channel, wherein the first gate is externally connected to a gate voltage; and a second current channel located within each of the at least two p-type body regions and between the second n-type source region and the n-type drift region, and a second gate, wherein the gate dielectric layer covers the second current channel, the second gate, the first n-type source region, the second n-type source region and the conductive layer are electrically connected to each other, and connected to an emitter voltage.

2. The IGBT power device of claim 1, wherein the conductive layer is an emitter metal contact layer located above the p-type body region, a doped concentration of the p-type body region contact region is lower than a maximum peak of a doped concentration of the p-type body region, and the p-type body region contact region and the emitter metal contact layer form a Schottky barrier diode structure.

3. The IGBT power device of claim 2, wherein the second gate, the first n-type source region and the second n-type source region are externally connected to the emitter voltage through the emitter metal contact layer.

4. The IGBT power device of claim 1, wherein the conductive layer is an n-type doped region located within the p-type body region, and the n-type doped region and the p-type body region contact region form a silicon-based body region contact diode structure.

5. The IGBT power device of claim 4, wherein the n-type doped region, the second gate, the first n-type source region and the second n-type source region are externally connected to the emitter voltage through the emitter metal contact layer.

6. The IGBT power device of claim 1, wherein a turn-on voltage of the first current channel is greater than a turn-on voltage of the second current channel.

7. The IGBT power device of claim 1, further comprising a gate groove, wherein the gate groove is located between two adjacent p-type body regions and recessed within the n-type drift region, the gate dielectric layer, the first gate and the second gate are arranged within the gate groove.

8. The IGBT power device of claim 7, further comprising a shielded gate groove recessed within the n-type drift region, wherein an opening of the shielded gate groove is located at a bottom of the gate groove, a third gate is arranged within the shielding gate groove, the third gate is separated from the n-type drift region, the first gate and the second gate through an insulating dielectric layer, and the third gate, the first n-type source region, the second n-type source region, the second gate and the conductive layer are electrically connected to each other, and connected to the emitter voltage.

9. The IGBT power device of claim 8, wherein the third gate extends upwardly into the gate groove.

* * * * *